US008430676B2

(12) United States Patent
Dang et al.

(10) Patent No.: US 8,430,676 B2
(45) Date of Patent: Apr. 30, 2013

(54) MODULAR SPACE TRANSFORMER FOR FINE PITCH VERTICAL PROBING APPLICATIONS

(75) Inventors: Son Dang, Gilbert, AZ (US); Rehan Kazmi, Gilbert, AZ (US); Gerald Back, Gilbert, AZ (US); Bahadir Tunaboylu, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 861 days.

(21) Appl. No.: 12/538,639

(22) Filed: Aug. 10, 2009

(65) Prior Publication Data

US 2011/0032063 A1 Feb. 10, 2011

(51) Int. Cl.
*H01R 12/00* (2006.01)
(52) U.S. Cl.
USPC ............................................ 439/66; 439/700
(58) Field of Classification Search .................... 439/66, 439/700
See application file for complete search history.

(56) References Cited

U.S. PATENT DOCUMENTS

| 6,844,749 B2 * | 1/2005 | Sinclair ................ 324/755.05 |
| 7,160,119 B2 * | 1/2007 | Rathburn .................... 439/77 |
| 7,771,210 B2 * | 8/2010 | Cherian ...................... 439/66 |

* cited by examiner

*Primary Examiner* — Gary F. Paumen
(74) *Attorney, Agent, or Firm* — Hickman Palermo Truong Becker Bingham Wong LLP; Edward A. Becker

(57) ABSTRACT

In an embodiment, a modular space transformer for use in a probe card assembly includes a bottom plate, a guide plate, and a top plate. The guide plate is configured for mounting in a cut-out of the bottom plate. The guide plate has a first surface and a second surface and additionally has a first plurality of spaced electrical connections disposed in a plurality of apertures formed through the guide plate for providing electrical connections between a plurality of test probe contacts and a plurality of guide plate contacts. The top plate has a plurality of spaced electrical contacts disposed through the top plate with at least one of the plurality of guide plate contacts electrically connected to at least one of the plurality of spaced electrical contacts.

14 Claims, 8 Drawing Sheets

MODULAR SPACE TRANSFORMER FOR FINE PITCH VERTICAL PROBING APPLICATIONS

FIELD OF THE INVENTION

This invention relates generally to integrated circuit testing using probe cards.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical connection is established between automatic test equipment (ATE) and each IC formed on the wafer to demonstrate proper performance of the IC's. Components that may be used in wafer testing include an ATE test board, which is a multilayer printed circuit board (PCB) that is connected to the ATE, and that transfers the test signals between the ATE and a probe card assembly. The probe test card assembly (or probe card) includes a PCB that generally contains several hundred probe needles (or "probes") positioned to establish electrical contact with a series of connection terminals (or "die contacts") on the IC wafer. Conventional probe card assemblies include a PCB, a substrate or probe head having a plurality of flexible test probes attached thereto, and a space transformer that electrically connects the probes to the PCB. The space transformer includes telescopic "spring pins" or solder bumps that provide electrical connections between conductive pads on the PCB and the space transformer and between the space transformer and conductive pads on the substrate. The test probes are conventionally mounted to electrically conductive, typically metallic, bonding pads on the substrate using solder attach, wire bonding or wedge bonding techniques.

The space transformer routs electrical contacts from very small pitches that typically exist on probe heads to a much larger pitch that is manufacturable for PCBs or other components in the assembly. While advances in silicon manufacturing technologies permit use of finer pitches, corresponding advances in existing space transformer technologies have failed to keep up, as more electrical contacts must fit in a smaller space. Thus as minimum pitch is reduced, manufacturing yield of space transformers is reduced, leading to higher costs.

Additionally, as parallel device testing techniques are incorporated into the manufacturing process, the increased number of interconnect contacts generates mechanical stress on the space transformer that could cause physical deformation of the space transformer past acceptable limits. The increased number of interconnect contacts in wired space transformers also leads to fragile wired space transformers which are more susceptible to damage and more cumbersome to repair.

Based on the foregoing, there is a need for a space transformer that does not suffer from limitations of conventional space transformers.

BRIEF DESCRIPTION OF THE DRAWINGS

In the figures of the accompanying drawings like reference numerals refer to similar elements.

DETAILED DESCRIPTION

Figure 1A:
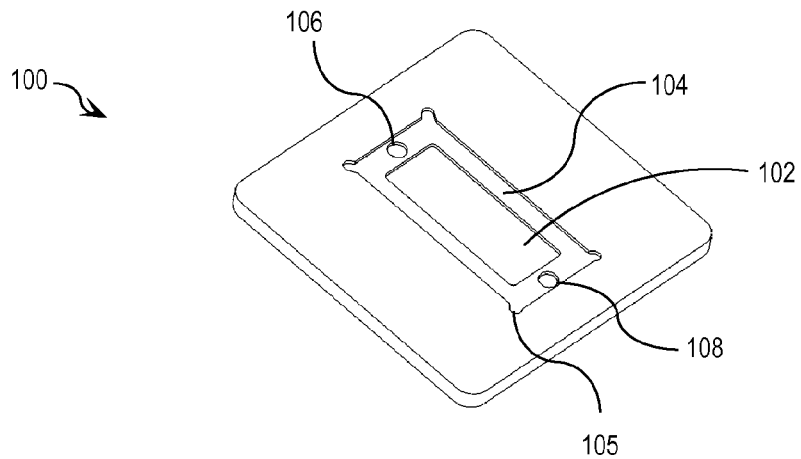
FIG. 1A depicts a bottom plate with cut-out for mounting a guide plate.

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Various aspects of the invention are described hereinafter in the following sections:

I. OVERVIEW
II. MODULAR SPACE TRANSFORMER INCLUDING TOP PLATE
III. MODULAR SPACE TRANSFORMER USING PERIPHERAL INTERCONNECTS
IV. MODULAR SPACE TRANSFORMER USING FLEX CIRCUITS, MULTILAYER ORGANIC, AND/OR MULTILAYER CIRCUITS
V. MODULAR SPACE TRANSFORMER USING WIRE BONDING STRATEGIES
VI. MODULAR SPACE TRANSFORMER USING MICRORIBBON OR FLEX CABLES

I. Overview

A modular space transformer uses a guide plate suitable for fine pitch applications. The modular space transformer offers both ease of assembly and ease of use, while permitting finer pitches and more complex wiring arrangements than conventional transformers.

In an embodiment, a modular space transformer for use in a probe card assembly includes a bottom plate, a guide plate, and a top plate. The bottom plate has a first surface and a second surface with an aperture or cut-out. The guide plate is configured for mounting in the cut-out of the bottom plate. The guide plate has a first surface and a second surface and additionally has a first plurality of spaced electrical connections disposed in a plurality of apertures formed through the guide plate for providing electrical connections between a plurality of test probe contacts and a plurality of guide plate contacts. The top plate has a first and second surface, with at least a portion of the second surface of the top plate mounted to at least a portion of the first surface of the bottom plate. The top plate also has a second plurality of spaced electrical contacts disposed through the top plate with at least one of the plurality of guide plate contacts electrically connected to at least one of the plurality of spaced electrical contacts. The second plurality of spaced electrical contacts on the top plate is configured to have a greater pitch than the plurality of apertures formed through the guide plate.

In an embodiment, a modular space transformer for use in a probe card assembly includes a bottom plate and guide plate. The bottom plate has a first surface and a second surface with an aperture or cut-out. A plurality of spaced electrical contacts is mounted to the first surface of the bottom plate outside the perimeter of the cut-out. The guide plate is configured for mounting in the cut-out of the bottom plate. The guide plate has a first surface and a second surface, the guide plate further having a plurality of spaced electrical connections disposed in a plurality of apertures formed through the guide plate for providing electrical connections between a plurality of test probe contacts on the second surface of the guide plate and the plurality of spaced electrical contacts. The plurality of spaced electrical contacts on the first surface of the bottom plate outside the perimeter of the cut-out is configured to have a greater pitch than the plurality of apertures formed through the guide plate.

In an embodiment, a modular space transformer for use in a probe card assembly includes a bottom plate having a first surface and a second surface. The bottom plate further comprises a cut-out and a plurality of spaced electrical contacts electrically connected to the first surface of the bottom plate outside the perimeter of the cut-out. A guide plate is configured for mounting in the cut-out of the bottom plate, the guide plate having a first surface and a second surface. The guide plate further includes a plurality of spaced electrical connections disposed in a plurality of apertures formed through the guide plate for providing electrical connections between a plurality of test probe contacts on the second surface of the guide plate and the plurality of spaced electrical contacts. The plurality of spaced electrical contacts have a greater pitch than the plurality of apertures formed through the guide plate.

II. Modular Space Transformer Including Top Plate

Sample Modular Components

An embodiment of a modular space transformer including a top plate is described with reference to FIGS. 1A-1C, followed by an example method for construction of the modular space transformer.

FIG. 1A depicts a bottom plate 100 with cut-out 102 for mounting a guide plate (not shown) using recess 104 and mounting holes 106 and 108. (Mounting holes 106 and 108 in FIG. 1A are exaggerated in size for illustrative purposes.) Each corner of recess 104 has guide plate recess 105 facilitating removal and replacement of the guide plate. In an embodiment, bottom plate 100 is made of any electrically insulating material such as a ceramic exhibiting good rigidity and thermal characteristics for use in the test environment.

Figure 1B:
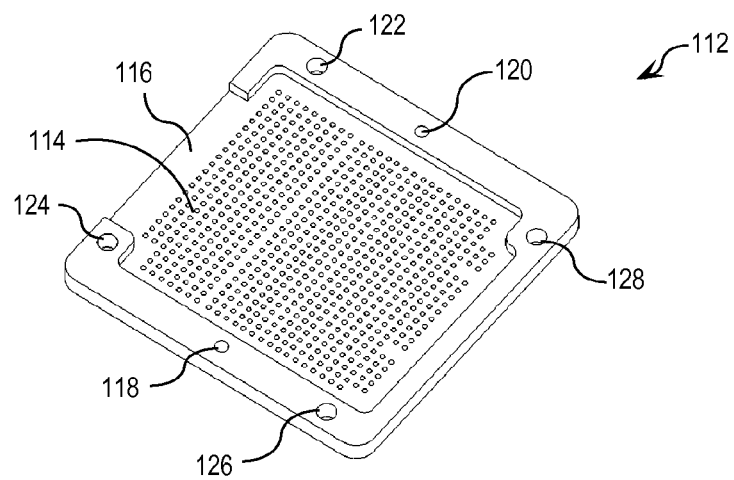
FIG. 1B depicts a top plate with holes spaced out to house one or more compliant pins.

FIG. 1B depicts top plate 112 with holes 114 spaced out to house one or more compliant pins (not shown). In an embodiment, once bottom plate 100 and top plate 112 are mated using pins (not shown) in alignment holes 118 and 120, opening 116 on top plate 112 is configured to permit access into the interior of the space transformer. In an embodiment, a retaining material or epoxy is injected through opening 116 into the interior of the space transformer after all electrical connections are configured. Addition of retaining material beneficially keeps electrical connections properly configured and increases the stability of the modular space transformer against mechanical shocks such as those experienced after dropping. Various configurations of electrical connections are described below with respect to FIGS. 1D-1E.

In an embodiment, bottom plate 100 and top plate 112 are affixed using screws inserted in screw apertures 122, 124, 126, 128.

Figure 1C:
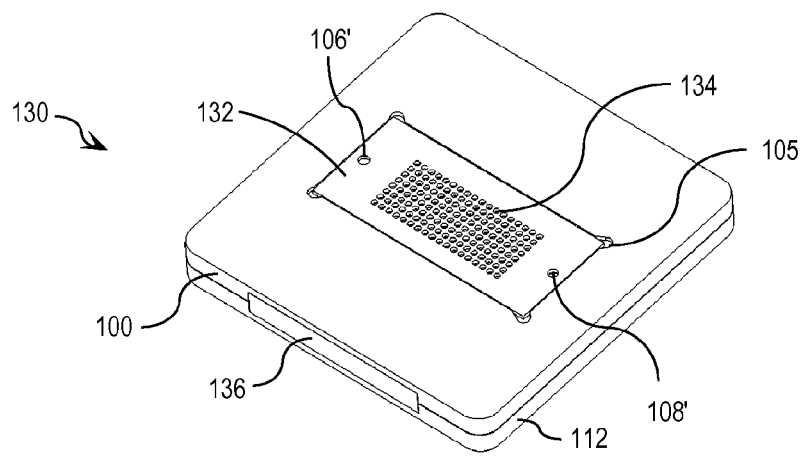
FIG. 1C depicts a complete assembly of an embodiment of a modular space transformer.
Figure 1D:
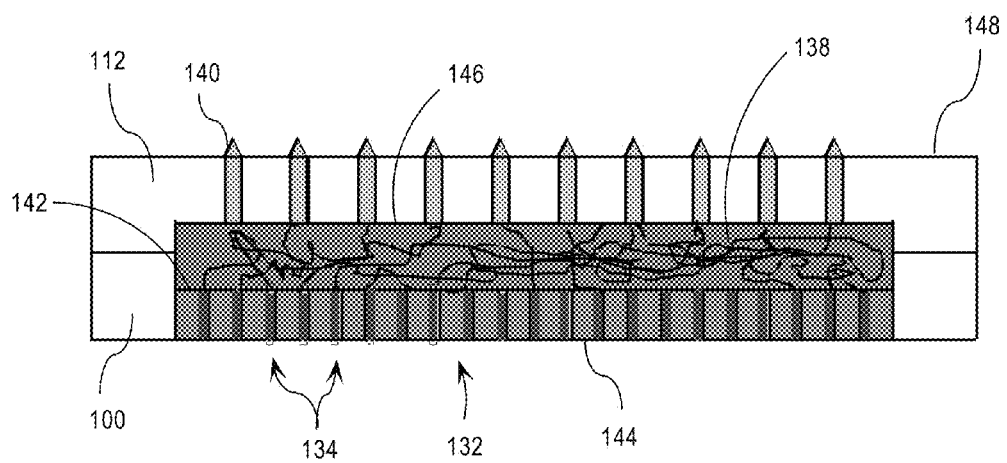
FIG. 1D depicts a side view of an embodiment of a modular space transformer.

FIG. 1C depicts modular space transformer 130 after assembly and depicts guide plate 132 mounted to bottom plate 100. Guide plate 132 has a plurality of apertures 134 formed through guide plate 132 for providing electrical connections between a plurality of test probe contacts (not shown) and a plurality of guide plate contacts (not shown). Mounting holes 106' and 108' on guide plate 132 align with mounting holes 106 and 108 on bottom plate 100.

In an embodiment, guide plate 132 is formed by using MEMS fabrication technology by etching features like holes, slots, etc., on a silicon substrate. In an embodiment, a dry reactive ion etching (DRIE) process is used to etch apertures 134 through the silicon substrate. In an embodiment, guide plate 132 is then coated with a layer of insulating material. Use of such a constructed guide plate 132 permits fine positioning accuracy of apertures 134.

In an embodiment, guide plate 132 comprises a plastic material.

As a non-limiting illustration, a sample assembled guide plate may have approximate size dimensions of 3 cm×3 cm, with an approximate hole count of 2000, with holes having an approximate diameter of 50 µm, and a pitch of 60 µm.

Sample Modular Assembly

Assembly of example modular space transformer 130 (as appears in FIG. 1C) is now described with respect to FIGS. 1A-1E. First, guide plate 132 is bonded to bottom plate 100 in the region defined by cut-out 102 using pins placed in mounting holes 106, 106' and 108, 108' to provide proper alignment.

An un-insulated first end of insulated wire 138 is populated through first surface 142 of guide plate 132 and configured to barely pass through second surface 144 of guide plate 132. In an embodiment, the un-insulated second end of insulated wire 138 is snug fitted in one or more selected holes 114 of top plate 112 entering along second surface 146 of top plate 112 and making electrical contact with one of compliant contacts 140 that extend above first surface 148 of top plate 112. In an embodiment, the ends of insulated wire 138 are retained uses a retaining material or epoxy. In an embodiment, compliant contacts 140 comprise spring pins that make electrical contact with pads on the attached PCB. In an embodiment, compliant contacts 140 are held in place by a retaining material or epoxy. In an embodiment, compliant contacts 140 are held in place by friction with top plate 112.

A retaining material such as epoxy may then be injected through opening 116, as shown in FIG. 1C. Curing the retaining material prevents both the wires and compliant contacts from moving away their configured positions. Opening 116 may then be closed by plate 136, thereby preventing access, and possible damage to, the internal wiring configuration.

Any wire ends 138 protruding from apertures 134 may then be cut, lapped, and plated to maintain the planarity of second surface 144. In an embodiment, lapping and plating is performed using gold because of the gold's excellent planarity characteristics and gold's extremely low contact resistance with the probes with which it will be in contact. Through this construction, designers may configure a nearly unlimited number of wiring configurations. Not all of apertures 134 need to be used in a particular assembly. This permits a common assembly to be used in a variety of physical configurations, thus lowering manufacturing costs through economy of scale.

Figure 1E:
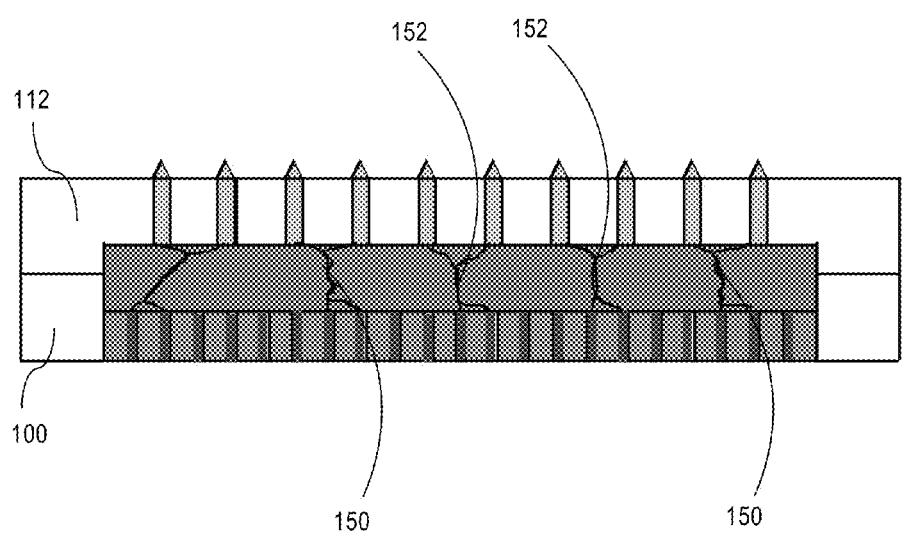
FIG. 1E depicts a side view of an embodiment of a modular space transformer having paired contacts for use in high-speed applications.

FIG. 1E depicts a cross-section view of an embodiment of a modular space transformer having paired contacts for use in high-speed applications in which minimization of crosstalk is beneficial. Twisted wire pair 150 and parallel wire pair 152 illustrate wiring techniques in which crosstalk is minimized and bandwidth is increased. In twisted wire pair 150, two wires are twisted around each other along a common axis. In parallel wire pair 152, two wires remain relatively parallel to each other. Additionally, these wiring techniques permit longer wiring distances up to approximately one inch in length, thereby accommodating an increased compliant contact pitch. Modular space transformers constructed using the techniques disclosed herein can be expected to operate at a frequency of one gigahertz or more.

Figure 2:
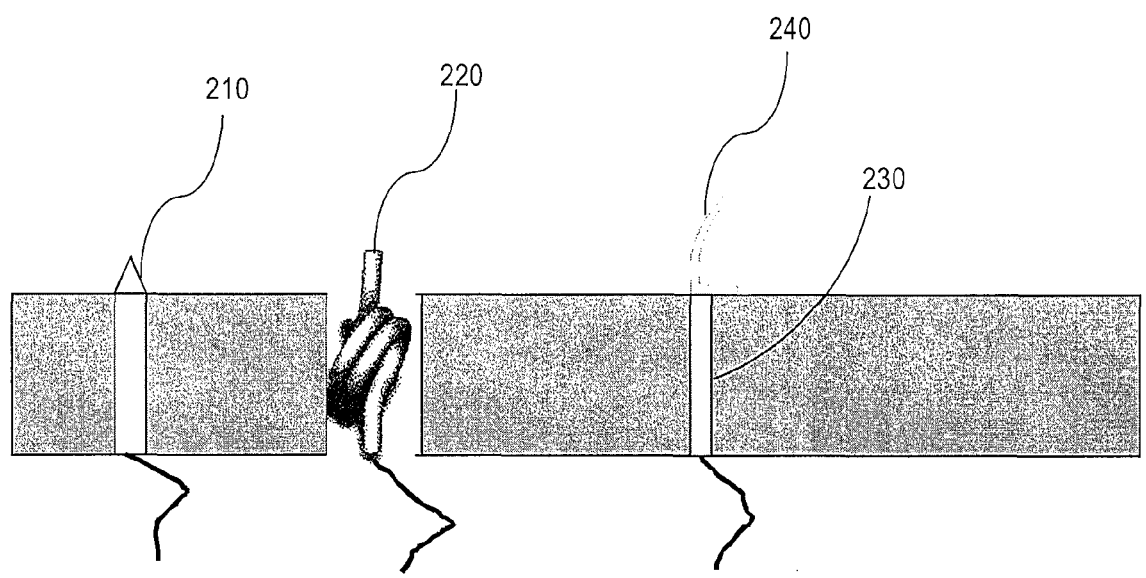
FIG. 2 depicts a variety of embodiments of compliant contacts for use in a modular space transformer.

FIG. 2 depicts a variety of embodiments of compliant contacts for use in a modular space transformer. Embodiments include, but are not limited to, spring pin 210, spring pin 220, and filled via 230 having a flexible contact 240. Such compliant contacts provide the compliance to the system through robust temporary interconnects to another component in the system, e.g., PCB, MLC, and the like. Assemblies may use a single type of compliant contact, or may use multiple types in a single assembly, depending on a particular implementation.

III. Modular Space Transformer Using Peripheral Interconnects

Figure 3A:
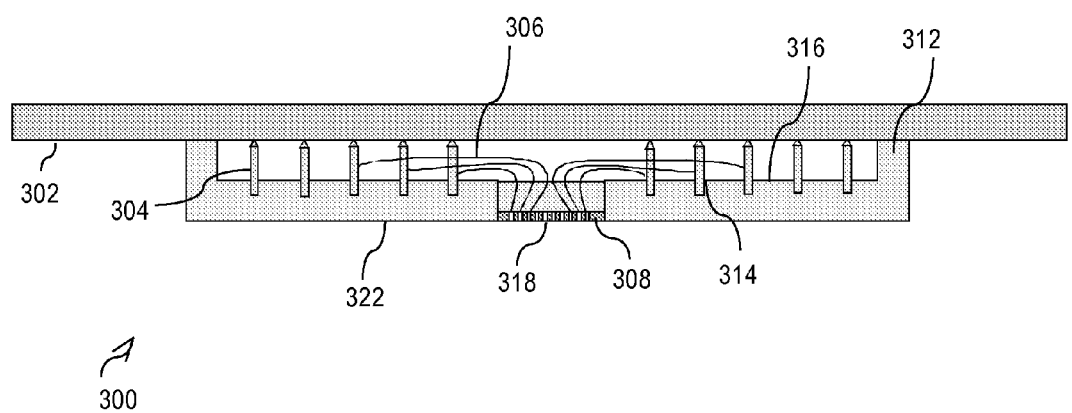
FIG. 3A depicts a side view of an embodiment of a modular space transformer mounted to a PCB.
Figure 3B:
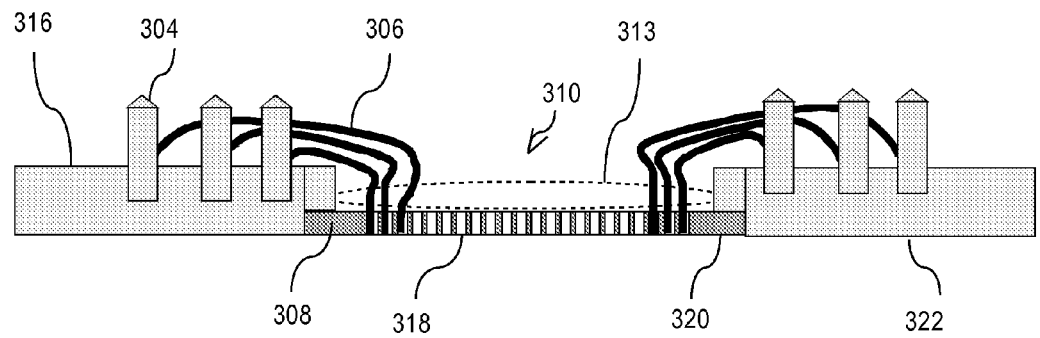
FIG. 3B depicts a zoomed-in view of the embodiment of the modular space transformer of FIG. 3A.

FIGS. 3A-3B depict a cross section of an embodiment of a modular space transformer mounted to a printed circuit board (PCB). In this embodiment, modular space transformer 300 has guide plate 308 bonded to bottom plate 312 having cut-out 310. Bottom plate 312 has blind holes 314 for holding compliant interconnects 304 around the periphery of cut-out 310 protruding from first surface 316 of bottom plate 312. In an embodiment, guide plate 308 comprises a silicon guide plate, similar to previous embodiments. Bottom plate 312 may be attached to PCB using an adhesive, or fasteners such as pins or screws.

Wires 306 pass through apertures 318 and then may be connected to compliant interconnects 304. In an embodiment, the pocket 313 of bottom plate 312 is covered with a thin layer of epoxy for retention of wires 306 in apertures 318 and compliant interconnects 304. Second surface 320 (FIG. 3B) of guide plate 308 facing a probe head is lapped for planarity and/or tilt adjustment. Second surface 322 of bottom plate 312 is in contact with the probe head, whereas the compliant pins are compressed against pads or other electrical contacts on PCB 302.

Figure 4A:
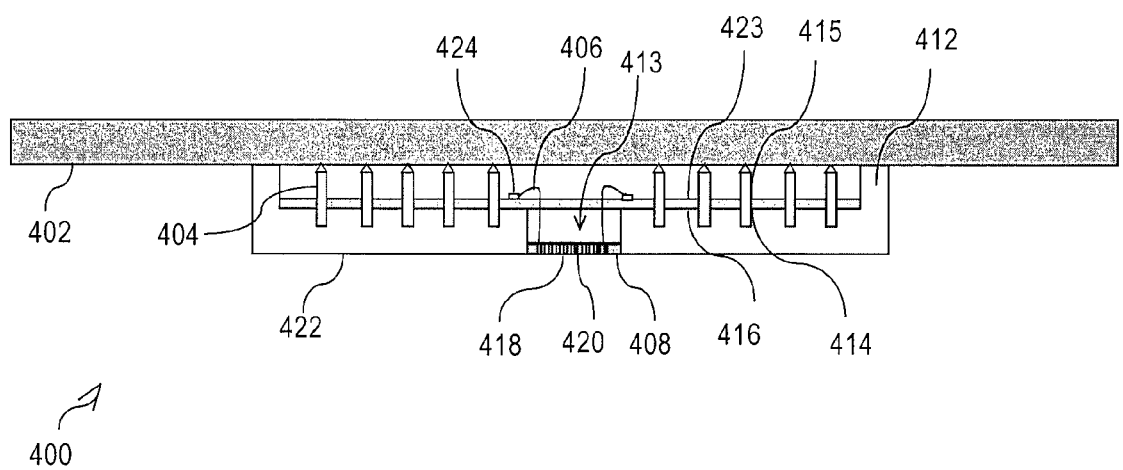
FIG. 4A depicts a side view of an embodiment of a modular space transformer using a flex circuit/MLO/MLC.
Figure 4B:
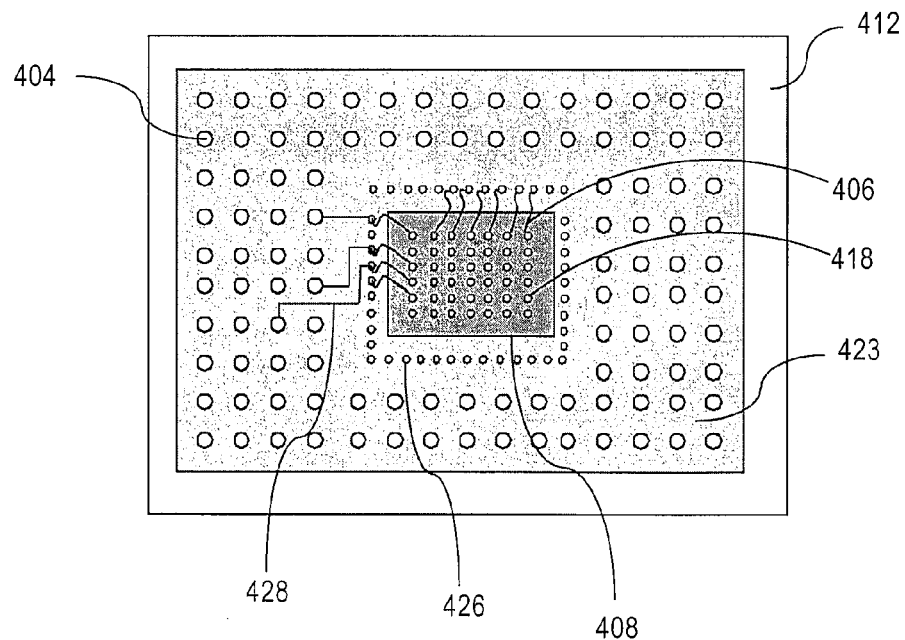
FIG. 4B depicts a top view (with PCB omitted) of the embodiment of the modular space transformer depicted in FIG. 4A.

IV. Modular Space Transformer Using Flex Circuits, Multilayer Organic, and/or Multilayer Circuits FIGS. 4A-4B depict an embodiment of modular space transformer using a flex circuit/multilayer organic (MLO)/multilayer circuit (MLC). As used herein, "flex circuit/MLO/MLC" designates an assembly comprising one or more of a flex circuit, MLO, and MLC. In a flex circuit, electronic devices may be mounted on flexible plastic substrates, such as polyimide and PEEK Film. Other flex circuits may be screen printed silver circuits on polyester.

Choice of an actual assembly for manufacturing may be determined by standard cost or other practical considerations, as the techniques herein may be applied to any combination. Flex circuits are inexpensive to manufacture, do not require much space within the transformer, and have flexible properties allowing for easier placement during the assembly process.

FIG. 4A depicts a side view of modular space transformer 400 having bottom plate 412 affixed to PCB 402. FIG. 4B depicts a slightly enlarged corresponding top view of modular space transformer 400 in which PCB 402 has been removed.

In this embodiment, flex circuit/MLO/MLC 423 is attached, e.g., via bonding, to first surface 416 of bottom plate 412. Guide plate 408 is then bonded in the cut-out region of bottom plate.

In an embodiment, flex circuit/MLO/MLC 423 is configured with apertures 415 that correspond with holes 414 in bottom plate 412, so that once flex circuit/MLO/MLC 423 is overlaid upon first surface 416 of bottom plate 412, apertures 415 and holes 414 align and permit insertion of compliant interconnects 404. In an embodiment, compliant interconnects are spring pins.

Wires 406 are inserted through apertures 418 of guide plate 408 and are then connected, e.g., via soldering, to inner row of pads 426 of flex circuit/MLO/MLC 423. Internal/external traces 428 electrically connect one or more of inner row of pads 426 to one or more compliant interconnects 404.

The pocket 413 of bottom plate 412 carrier containing guide plate 408 may be filled with a thin layer of epoxy for retention of wires 406 in apertures 418 of guide plate 408 and compliant interconnects 404. Second surface 420 of guide plate 408 (facing towards the probe head) is then lapped for planarity and/or tilt adjustment. The lower portion of modular space transformer 400 is in contact with the probe head whereas compliant interconnects are compressed against the PCB as in the embodiment of FIG. 3.

V. Modular Space Transformer Wire Bonding Strategies

Figure 5:
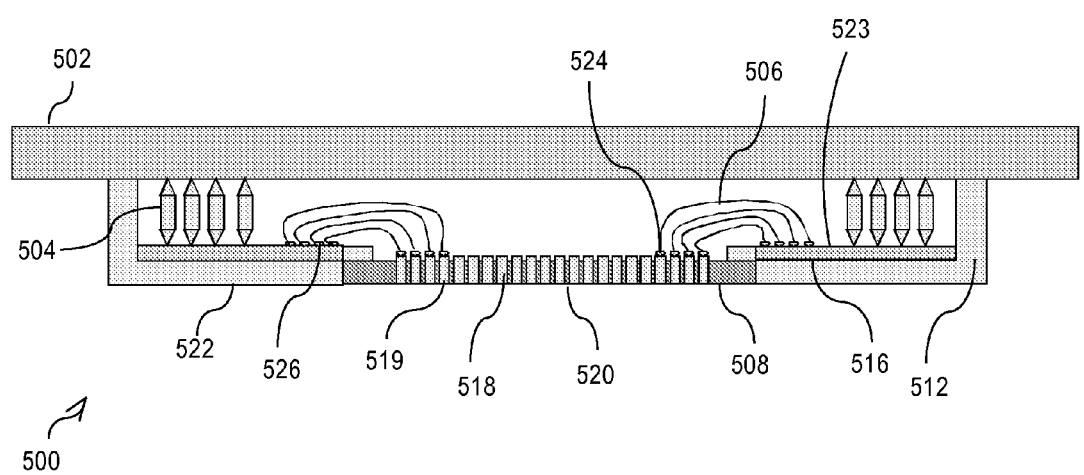
FIG. 5 depicts a side view of an embodiment of a modular space transformer using a flex circuit/MLO/MLC and movable compliant interconnects.

FIG. 5 depicts a side view of an embodiment of a modular space transformer using a flex circuit/MLO/MLC in conjunction with wire bonding strategies and movable compliant interconnects. In this embodiment, flex circuit/MLO MLC 523 is overlaid upon first surface 516 of bottom plate 512 and surrounds the cut-out of bottom plate 512. Compliant interconnects 504 do not pierce flex circuit/MLO/MLC 523, but are held in place by spring tension or an adhesive placed on pads of the PCB. Wires 519 (such as copper or other conductive alloys) are inserted into apertures 518 and lapped from either side of the silicon or silicon nitride guide plate 508 to generate wire bond pads or contact surface. Both ends of apertures 518 are then overplated with gold to serve as electrical contacts. The first end of wire 506 is connected to pad 524, and second end of wire 506 connected to pad 526 sitting on flex circuit/MLO/MLC 523 using wire bond techniques. The pocket of the bottom plate carrier 512 containing the guide plate 508 may be filled with epoxy to provide some more rigidity to the assembly. Traces on flex circuit/MLO/MLC 523 complete the connection of one or more pads 526 to one or more compliant interconnects 504. In this configuration, both wires 506 and compliant interconnects 504 may be easily re-arranged, thus permitting a single modular space transformer re-usable for a multitude of test configurations.

VI. Modular Space Transformer Using Microribbon or Flex Cables

Figure 6A:
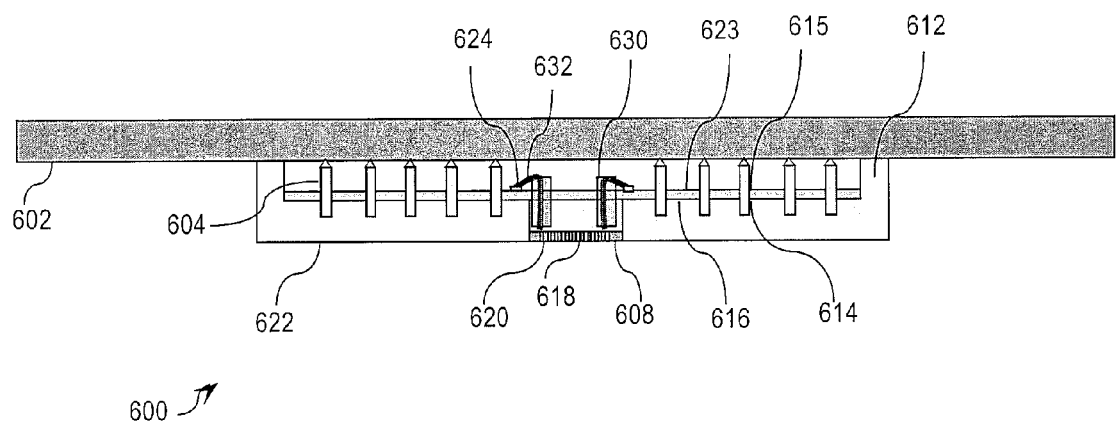
FIG. 6A depicts an embodiment of modular space transformer using a flex circuit/MLO/MLC in conjunction with wire bonding strategies.
Figure 6B:
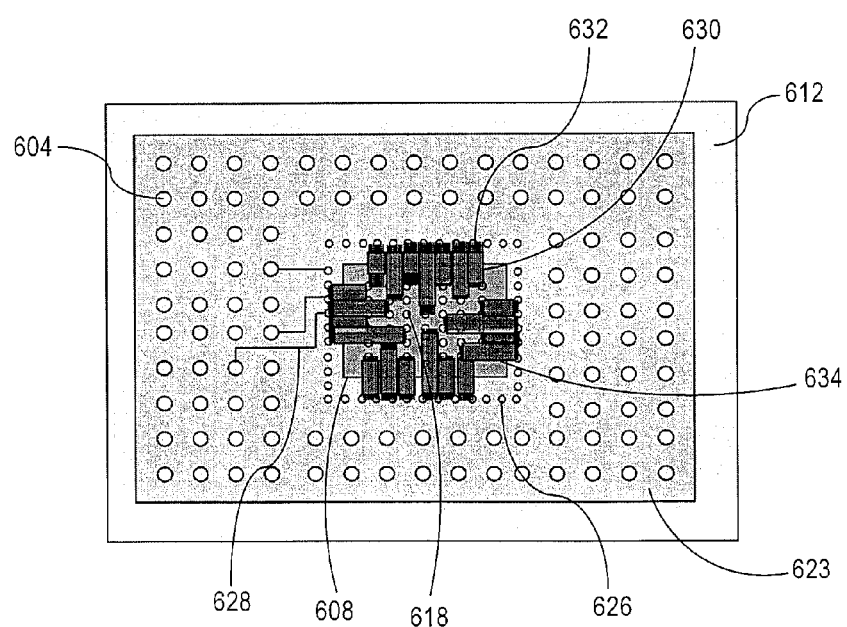
FIG. 6B depicts a top view (with PCB omitted) of the embodiment of the modular space transformer depicted in FIG. 6A.

FIG. 6A-6B depicts an embodiment of modular space transformer using a flex circuit/MLO/MLC in conjunction with ribbon cables. FIG. 6A depicts a side view of modular space transformer 600 having bottom plate 612 affixed to PCB 602. FIG. 6B depicts a slightly enlarged corresponding top view of modular space transformer 600 in which PCB 602 has been removed.

In this embodiment, flex circuit/MLO/MLC 623 is bonded on first surface 616 of bottom plate 612. Guide plate 608 is then bonded in the cut-out region of bottom plate.

In an embodiment, flex circuit/MLO MLC 623 is configured with apertures 615 that correspond with holes 614 in bottom plate 612, so that once flex circuit/MLO/MLC 623 is overlaid upon first surface 616 of bottom plate 612, apertures 615 and holes 614 align and permit insertion of compliant interconnects 504. In an embodiment, compliant interconnects 604 are spring pins.

In an embodiment, flex circuit/MLO MLC 623 is not configured with apertures, and similarly bottom plate 612 is not configured with holes. In this configuration, once flex circuit/MLO/MLC 623 is overlaid upon first surface 616 of bottom plate 612, compliant interconnects 604 do not pierce flex circuit/MLO/MLC 623, but are held in place by spring tension or an adhesive.

Assembly of this embodiment differs from the previous embodiment as parallel wire ribbons 630 or flex cable 634 are used to provide electrical connections from apertures 618 of guide plate 608 to inner row of pads 626 of flex circuit/MLO/MLC 623. Use of parallel wire ribbons 630 or flex cable 634 controls distances between electrical paths contained in parallel wire ribbons or flex cable 634, thereby improving signal integrity and permitting use of finer structures.

Figure 7:
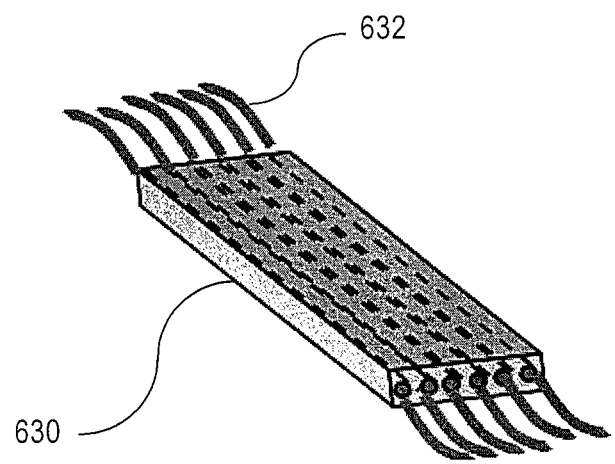
FIG. 7 depicts both parallel wire ribbons and flex cable that may be used in the embodiment of FIG. 5A.
Figure 7:
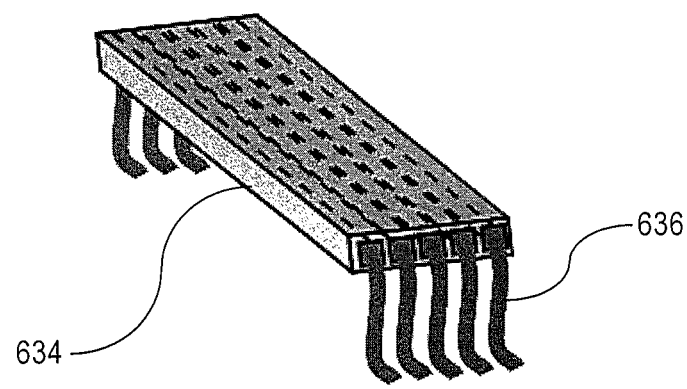

FIG. 7 depicts parallel wire ribbons 630 having circular parallel wires 632 and flex cable 634 having rectangular traces 636, with actual connections made using parallel wires 632 and traces 636.

In an embodiment, parallel wire ribbons 630 contain electrical paths having a diameter of approximately 35 microns. Smaller diameters such as 25 microns or less appear feasible.

In an embodiment, outer construction of parallel wire ribbons 630 comprises a polymer glue material. In an embodiment, flex cable 634 may be made using a PCB process using etching and lamination.

Whereas current guide plates have a pitch of approximately 400-500 microns, the silicon wafer technology techniques described herein have resulted in guide pitches of less than 60 microns, with further reductions likely. As the silicon guide plates have thermal characteristics similar to the silicon chips under testing, the resulting modular space transformers retain finer pitch tolerances over a wide range of temperatures corresponding to temperatures used in silicon manufacturing processes. Other materials, such as silicon nitride, could be used in the manufacture of guide plates.

In the foregoing specification, embodiments of the invention have been described with reference to numerous specific details that may vary from implementation to implementation. Thus, the sole and exclusive indicator of what is, and is intended by the applicants to be the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A modular space transformer comprising:
    a bottom plate having a first surface and a second surface, the bottom plate further comprising a cut-out;
    a guide plate configured for mounting in the cut-out of the bottom plate, the guide plate having a first surface and a second surface, the guide plate further having a first plurality of spaced electrical connections disposed in a plurality of apertures formed through the guide plate for providing electrical connections between a plurality of test probe contacts and a plurality of guide plate contacts; and
    a top plate having a first and second surface, at least a portion of the second surface of the top plate mounted to at least a portion of the first surface of the bottom plate, the top plate further having a second plurality of spaced electrical contacts disposed through the top plate with at least one of the plurality of guide plate contacts electrically connected to at least one of the second plurality of spaced electrical contacts,
    wherein the second plurality of spaced electrical contacts on the top plate have a greater pitch than the plurality of apertures formed through the guide plate.

2. The modular space transformer recited in claim 1, wherein the top plate and the bottom plate comprise ceramic and the guide plate comprises silicon.

3. The modular space transformer recited in claim 1, wherein the portion of the second surface of the top plate is mounted to the portion of the first surface of the bottom plate using screws.

4. The modular space transformer recited in claim 1, wherein the top plate is configured to form a space between the second plurality of spaced electrical contacts and the plurality of guide plate contacts when the portion of the second surface of the top plate is mounted to the portion of the first surface of the bottom plate.

5. The modular space transformer recited in claim 4, wherein at least one of the plurality of guide plate contacts is electrically connected to at least one of the second plurality of spaced electrical contacts by an insulated wire.

6. The modular space transformer recited in claim 1, wherein the plurality of test probe contacts is plated with an electrically conductive material and wherein the second plurality of spaced electrical contacts are spring pins.

7. A modular space transformer comprising:
    a bottom plate having a first surface and a second surface, the bottom plate further comprising a cut-out and a plurality of spaced electrical contacts electrically connected to the first surface of the bottom plate outside the perimeter of the cut-out;
    a guide plate configured for mounting in the cut-out of the bottom plate, the guide plate having a first surface and a second surface, the guide plate further having a plurality of spaced electrical connections disposed in a plurality of apertures formed through the guide plate for providing electrical connections between a plurality of test probe contacts on the second surface of the guide plate and the plurality of spaced electrical contacts,
    wherein the plurality of spaced electrical contacts have a greater pitch than the plurality of apertures formed through the guide plate.

8. The modular space transformer of claim 7, wherein the plurality of spaced electrical contacts are mounted to the first surface of the bottom plate outside the perimeter of the cut-out.

9. The modular space transformer of claim 8, wherein the plurality of spaced electrical contacts are spring pins.

10. The modular space transformer of claim 7, further comprising a flex circuit mounted to the first surface of the bottom plate outside the perimeter of the cut-out of the bottom plate, wherein the flex circuit is electrically connected to: (a)

at least one of the plurality of spaced electrical contacts; and (b) at least one of the plurality of spaced electrical connections disposed in a plurality of apertures formed through the guide plate.

11. The modular space transformer of claim 10, wherein at least one of the plurality of spaced electrical connections passes through the flex circuit and is mounted to the first surface of the bottom plate outside the perimeter of the cut-out of the bottom plate.

12. The modular space transformer of claim 10, wherein at least a first end of one of the plurality of spaced electrical connections makes electrical contact with a first surface of the flex circuit.

13. The modular space transformer of claim 10, further comprising a parallel wire ribbon providing electrical contact between (a) at least one of the plurality of spaced electrical connections disposed in the plurality of apertures formed through the guide plate and (b) at least one pad on the flex circuit disposed around the perimeter of the cut-out, wherein a trace provides electrical contact between (c) the at least one pad and (d) the at least one of the plurality of spaced electrical connections.

14. The modular space transformer of claim 10, further comprising a flex cable providing electrical contact between (a) at least one of the plurality of spaced electrical connections disposed in the plurality of apertures formed through the guide plate and (b) at least one pad on the flex circuit disposed around the perimeter of the cut-out, wherein a trace provides electrical contact between (c) the at least one pad and (d) the at least one of the plurality of spaced electrical connections.

* * * * *